US009966695B2

(12) United States Patent
Fernandez et al.

(10) Patent No.: US 9,966,695 B2
(45) Date of Patent: May 8, 2018

(54) CABLE CLAMPING SYSTEM FOR STRAIN RELIEF AND GROUNDING

(71) Applicant: Rockwell Automation Technologies, Inc., Mayfield Heights, OH (US)

(72) Inventors: Juan Fernandez, Brown Deer, WI (US); Brijeshkumar Meghpara, Germantown, WI (US); David A. Figie, Menomonee Falls, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days. days.

(21) Appl. No.: 15/353,644

(22) Filed: Nov. 16, 2016

(65) Prior Publication Data

US 2017/0062973 A1 Mar. 2, 2017

Related U.S. Application Data

(63) Continuation-in-part of application No. 14/709,049, filed on May 11, 2015, now Pat. No. 9,666,978.

(51) Int. Cl.

| | |
|---|---|
| ***H05K 7/00*** | (2006.01) |
| ***H01R 13/58*** | (2006.01) |
| ***H01R 13/6592*** | (2011.01) |
| ***H01R 4/44*** | (2006.01) |
| ***H01R 4/64*** | (2006.01) |
| ***H01R 13/6594*** | (2011.01) |

(52) U.S. Cl.
CPC ........... *H01R 13/5804* (2013.01); *H01R 4/44* (2013.01); *H01R 4/64* (2013.01); *H01R 13/6592* (2013.01); *H01R 13/6594* (2013.01)

(58) Field of Classification Search
CPC ........ H01R 4/44; H01R 4/64; H01R 13/6592; H01R 13/6594; H01R 13/5804
USPC ........................................ 361/728, 801, 803
See application file for complete search history.

(56) References Cited

U.S. PATENT DOCUMENTS

| | | | | |
|---|---|---|---|---|
| 1,957,462 | A | 5/1934 | Kress | |
| 4,018,982 | A * | 4/1977 | Svekis | F24H 3/002 174/663 |
| 5,597,331 | A | 1/1997 | Gable et al. | |
| 5,601,260 | A | 2/1997 | Shinohara et al. | |
| 5,688,091 | A * | 11/1997 | McKinlay | F16B 39/282 411/136 |
| 5,941,483 | A | 8/1999 | Baginski | |
| 5,992,802 | A | 11/1999 | Campbell | |
| 6,241,200 | B1 | 6/2001 | Camporeale et al. | |

(Continued)

*Primary Examiner* — Hung S Bui
(74) *Attorney, Agent, or Firm* — Fay Sharpe LLP

(57) ABSTRACT

An electronics module includes a housing including a wall. A cable clamp chassis projects outwardly from the housing wall. The cable clamp chassis includes first and second cable receiving locations respectively adapted to receive associated first and second cables. A clamp is secured to the cable clamp chassis by a fastener. The clamp is adapted to secure first and second associated cables in the first and second cable receiving locations. The fastener comprises a two-piece structure including a bolt and a head non-rotatably engaged with the bolt. The housing wall is provided as part of a sheet metal wall structure and the cable clamp chassis is cast metal or another monolithic conductive structure. The two-piece fastener comprises a carbon steel or stainless steel bolt and a cast metal or molded polymeric head that is non-rotatably engaged with a bolt head of the bolt.

18 Claims, 13 Drawing Sheets

(56) References Cited

U.S. PATENT DOCUMENTS

| | | | | |
|---|---|---|---|---|
| 6,679,722 | B1 * | 1/2004 | Pulizzi | H01R 13/562 439/451 |
| 6,890,191 | B1 * | 5/2005 | Thorburn | H01R 4/646 439/607.41 |
| 7,007,900 | B2 | 3/2006 | Goodwin et al. | |
| 7,077,688 | B2 * | 7/2006 | Peng | H02G 3/32 248/68.1 |
| 7,223,119 | B2 | 5/2007 | Droesbeke | |
| 7,514,630 | B2 | 4/2009 | Anderson | |
| 7,553,279 | B1 | 6/2009 | Phillips et al. | |
| 7,657,985 | B2 | 2/2010 | McClure | |
| 7,780,461 | B1 | 8/2010 | Vernica | |
| 7,876,580 | B2 * | 1/2011 | Mayer | H02G 15/007 361/825 |
| 8,063,317 | B2 | 11/2011 | Bowman | |
| 8,092,248 | B2 | 1/2012 | Van Stiphout et al. | |
| 8,721,689 | B2 | 5/2014 | Butler et al. | |
| 8,756,866 | B2 | 6/2014 | Lee | |
| 8,777,643 | B2 | 7/2014 | De France | |
| 8,821,173 | B2 | 9/2014 | Carnevali | |
| 2003/0108385 | A1 | 6/2003 | Finco et al. | |
| 2003/0162435 | A1 | 8/2003 | Holman et al. | |
| 2005/0023021 | A1 * | 2/2005 | Grady | H02G 3/126 174/50 |
| 2005/0039941 | A1 * | 2/2005 | Marroquin | H01R 13/655 174/78 |
| 2006/0064093 | A1 | 3/2006 | Thramann et al. | |
| 2007/0066101 | A1 | 3/2007 | Suzuki | |
| 2007/0167087 | A1 | 7/2007 | Tamm et al. | |
| 2010/0043297 | A1 | 2/2010 | Barr et al. | |
| 2010/0054689 | A1 | 3/2010 | Mullaney et al. | |
| 2010/0136822 | A1 | 6/2010 | Van Stiphout et al. | |
| 2011/0081800 | A1 | 4/2011 | Heise et al. | |
| 2011/0265290 | A1 | 11/2011 | Carnevali | |
| 2011/0303456 | A1 | 12/2011 | Blanchard et al. | |
| 2011/0315830 | A1 | 12/2011 | Eshima et al. | |
| 2012/0112014 | A1 | 5/2012 | Eshima et al. | |
| 2012/0230646 | A1 | 9/2012 | Thompson et al. | |
| 2013/0020123 | A1 | 1/2013 | Ruth | |
| 2014/0014407 | A1 | 1/2014 | Krieg et al. | |
| 2016/0105007 | A1 * | 4/2016 | Garvin | H02G 3/085 174/663 |

* cited by examiner

CABLE CLAMPING SYSTEM FOR STRAIN RELIEF AND GROUNDING

CROSS REFERENCE TO RELATED APPLICATION

This application is a continuation-in-part of co-pending U.S. application Ser. No. 14/709,049 filed May 11, 2015 (May 11, 2015), and the entire disclosure of said prior application is hereby expressly incorporated by reference into the present specification.

BACKGROUND

Motor drives and other electronics modules require cable strain relief and cable EMI/RFI shield grounding for secure connection of the associated cable to the module and for establishing a low impedance ground path to a desired ground location. Many structures are known for providing the required strain relief and ground path.

Known systems have been found to be suboptimal with respect to the physical location of the cables in cases where more than one cable must be connected to the module, especially when used in connection with a narrow module, which can lead to the multiple cables being positioned undesirably outside of the width of the module where they can interfere with cables of adjacent modules, present an obstacle for mounting of an adjacent module, and generally detract from the proper mounting an installation of the module and its associated cables or adjacent modules and the associated cables thereof.

Another drawback of known cable strain relief and grounding arrangements is that the cable clamping structures for operatively securing the cable(s) to the chassis of the electronics module are sometimes difficult to use, require special tools, are subject to loss of parts, do not work well when cables of different sizes must be accommodated or when some cables are omitted, or have been found to be too complex and/or expensive.

Known structures have not effectively provided for the combination of a module enclosure with a separate cable strain relief structure connected thereto and in which the separate strain relief structure is directly electrically connected to a ground path of a printed circuit board assembly when connected to the module enclosure.

A further drawback associated with known cable strain relief structures is that a need has sometimes been found for a stronger fastener used to clamp the cable(s) in position while still provided the advantages of a fastener locking structure that inhibits unintended reverse rotation of the fastener in harsh environments including vibration and other forces that tend to loosen fasteners.

In light of the foregoing issues and others associated with known cable strain relief and grounding systems for electronics modules, a need has been identified for a new and improved electronics module cable clamping system for strain relief and grounding.

SUMMARY

In accordance with one aspect of the present development, an electronics module includes a housing with a wall. A cable clamp chassis is connected to and projects outwardly from the housing wall. The cable clamp chassis includes first and second cable receiving locations respectively adapted to receive associated first and second cables. A clamp is secured to said cable clamp chassis by a fastener. The clamp is adapted to secure first and second associated cables in the first and second cable receiving locations. The fastener comprises a two-piece structure including a bolt and a head non-rotatably engaged with the bolt.

In one embodiment of the present development, the housing wall is provided as part of a sheet metal wall structure to which the cable clamp chassis is connected.

In accordance with a further aspect of the present development, the two-piece fastener comprises a carbon steel, stainless steel, aluminum, or other metallic bolt and a cast metal or molded polymeric head that is non-rotatably engaged with a bolt head of the bolt.

DETAILED DESCRIPTION

Figure 1B:
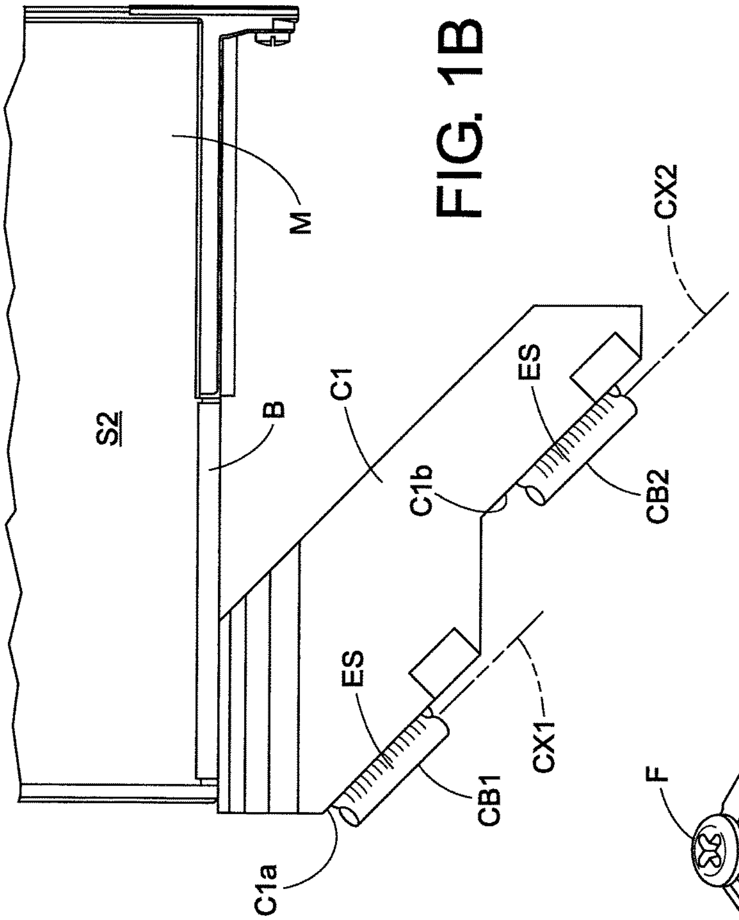
FIGS. 1A and 1B are respective partial front and right side views of an electronics module including a first embodiment of a cable clamp chassis in accordance with the present development.
Figure 1C:
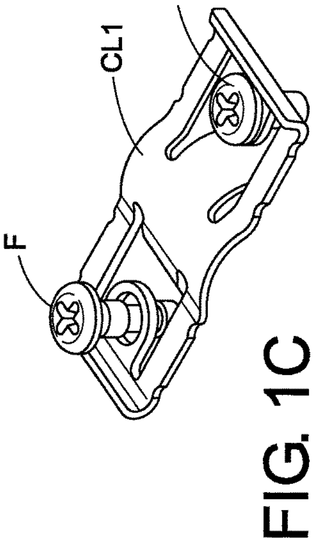
FIG. 1C illustrates a known cable clamp to be used with the cable clamp chassis of FIGS. 1A and 1B.
Figure 1A:
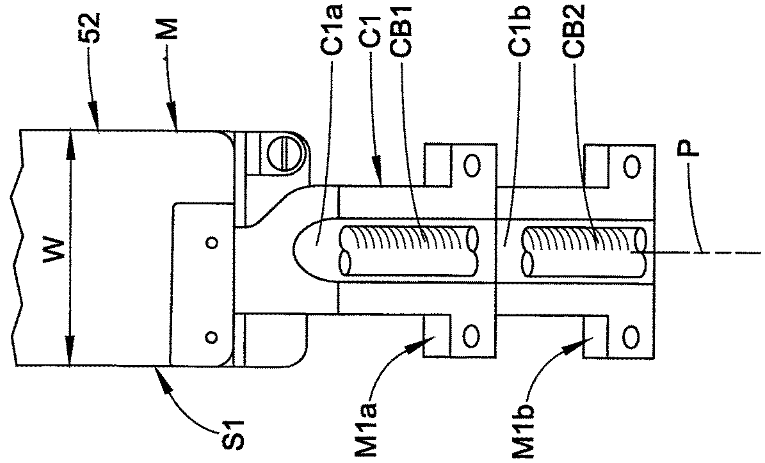

FIGS. 1A and 1B are respective partial front and right side views of an electronics module M including a first embodiment of a cable clamp chassis C1 in accordance with the present development. The module M can be any type of enclosure or mounting structure defining an internal space or other location for mounting electronic components thereto. As shown herein, the module M comprises a motor drive module, but is not intended to be limited to same.

The module M includes a cable clamp chassis C1 according to a first embodiment and to which at least one cable CB1,CB2 is secured when the cable is electrically connected to the circuitry contained in the module M. The clamp chassis C1 is defined as a metallic structure such as a casting or other structure that is connected to and projects outwardly or downwardly from a bottom side or bottom wall B of the module M. The bottom wall B extends between left and right side walls S1,S2 of the module M. In one embodiment, the clamp chassis comprises a one-piece zinc die-casting, but other materials and structures are contemplated. The clamp chassis C1 is provided to secure the one or more cables to the module M for providing strain relief to prevent pulling forces on the cable from being transmitted to the electrical coupling of the cable to the module M, and to electrically connect with the electrical magnetic interference (EMI) and/or radio frequency interference (RFI) shield (the EMI and/or RFI shield is referred to generally herein as an "EMI shield") of the cables to provide a ground path to a desired location through the clamp chassis C1 and module M.

The module M defines a lateral width W between its left and right side walls S1,S2, and the multiple modules M are often mounted in series with the right side wall S2 of a first module abutted or adjacent the left side wall S1 of a second module. Such an arrangement is complicated if the cables connected to each module are arranged in a row that extends laterally between the side walls S1,S2, as cables on the opposite ends of the row will often protrude beyond the side walls S1,S2 and interfere with the adjacent module. According to one aspect of the present development, however, the clamp chassis C1 restrains the cables CB1,CB2 in a "zero stack" configuration. More particularly, the clamp chassis C1 includes at least first and second (and optionally three or more) cable receiving or cable mounting locations C1*a*,C1*b* that are dimensioned and otherwise adapted to receive respective first and second cables CB1,CB2. As illustrated herein, each cable receiving location C1*a*,C1*b* comprises an axially extending recess with its surface preferably defined by a circular arc segment. The cable mounting locations C1*a*,C1*b* are centered on a common reference plane P that extends parallel to the left and right sidewalls S1,S2 such that the cables CB1,CB2 respectively located therein are likewise centered on the plane P, i.e., the respective origins of the circular arc segments defining each surface C1*a*,C1*b* are located in the plane P such that the longitudinal axis CX1,CX2 of each cable CB1,CB2 lies in the plane P and such that the reference plane P bisects the circular arc segment surfaces of the first and second cable mounting locations C1*a*,C1*b*. The plane P preferably lies roughly midway between the left and right sidewalls S1,S2. With the two or more cables CB1,CB2 aligned in a single plane P, the cables CB1,CB2 are located where they will not interfere with adjacent modules or the cables associated with same.

FIG. 1C illustrates a known clamp CL1 that is used to secure the cables CB1,CB2 in their respective receiving locations C1*a*,C1*b*, with a first one of the clamps CL1 secured via fasteners F to a first mounting location M1*a* located adjacent the first cable receiving location C1*a*, and with a second one of the clamps CL1 secured via fasteners F to a second mounting location M1*b* located adjacent the second cable receiving location C1*b*. The structure and operation of the clamp CL1 is described more fully in commonly owned U.S. Patent App. Pub. 2014/0014407 A1, the entire disclosure of which is hereby expressly incorporated by reference into the present specification. The outer electrical insulation of the cables CB1,CB2 is removed in the region where the cables CB1,CB2 are respectively seated in the cable receiving locations C1*a*,C1*b* to expose an electrically conductive sheath ES such that the sheath ES is electrically connected to the clamp chassis C1 and the clamp CL1 for conducting electrical interference in the sheath ES to a ground path of the module M through the clamp chassis C1.

Figure 2B:
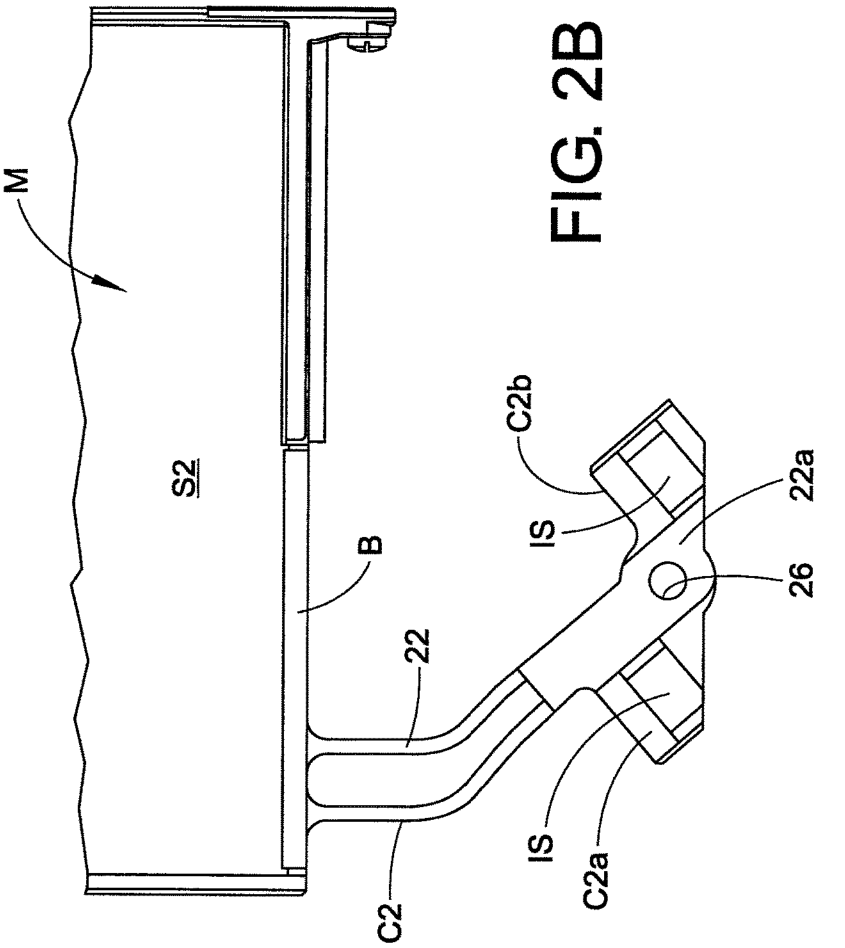
FIGS. 2A and 2B are respective partial front and right side views of an electronics module including a second embodiment of a cable clamp chassis in accordance with the present development.
Figure 2A:
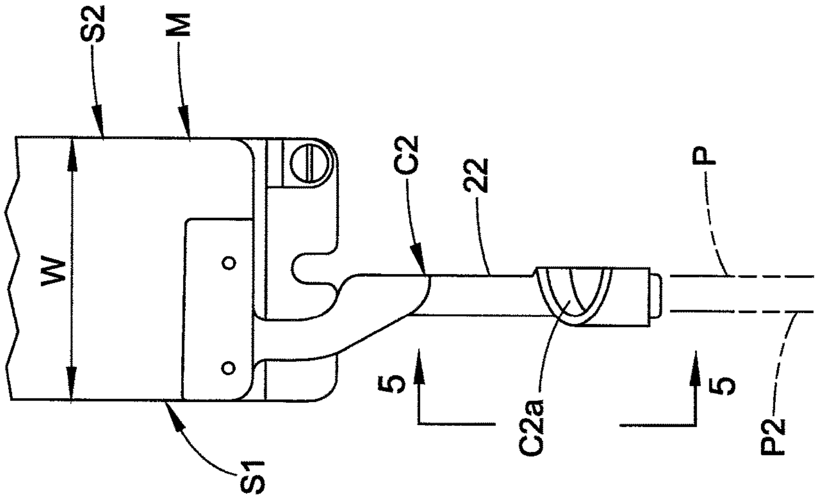

FIGS. 2A and 2B are respective partial front and right side views of an electronics module M including a second embodiment of a cable clamp chassis C2 in accordance with the present development and to which at least one cable CB1,CB2 is secured when the cable is electrically connected to the circuitry contained in the module M. The clamp chassis C2 also provides a zero stack cable mounting arrangement for strain relief and grounding as described above for the cable clamp chassis C1.

The clamp chassis C2 is also defined as a metallic structure such as a casting or other structure that is connected to and projects outwardly or downwardly from a bottom side B of the module M. In one embodiment, the clamp chassis C2 comprises a one-piece zinc die-casting, but other materials and structures are contemplated. The clamp chassis C2 is provided to secure the one or more cables to the module M for providing strain relief to prevent pulling forces on the cable from being transmitted to the electrical coupling of the cable to the module M, and to electrically connect with the electrical magnetic interference/radio frequency interference (EMI/RFI) shield ES of the cable to provide a ground path to a desired location through the clamp chassis C2.

Figure 3:
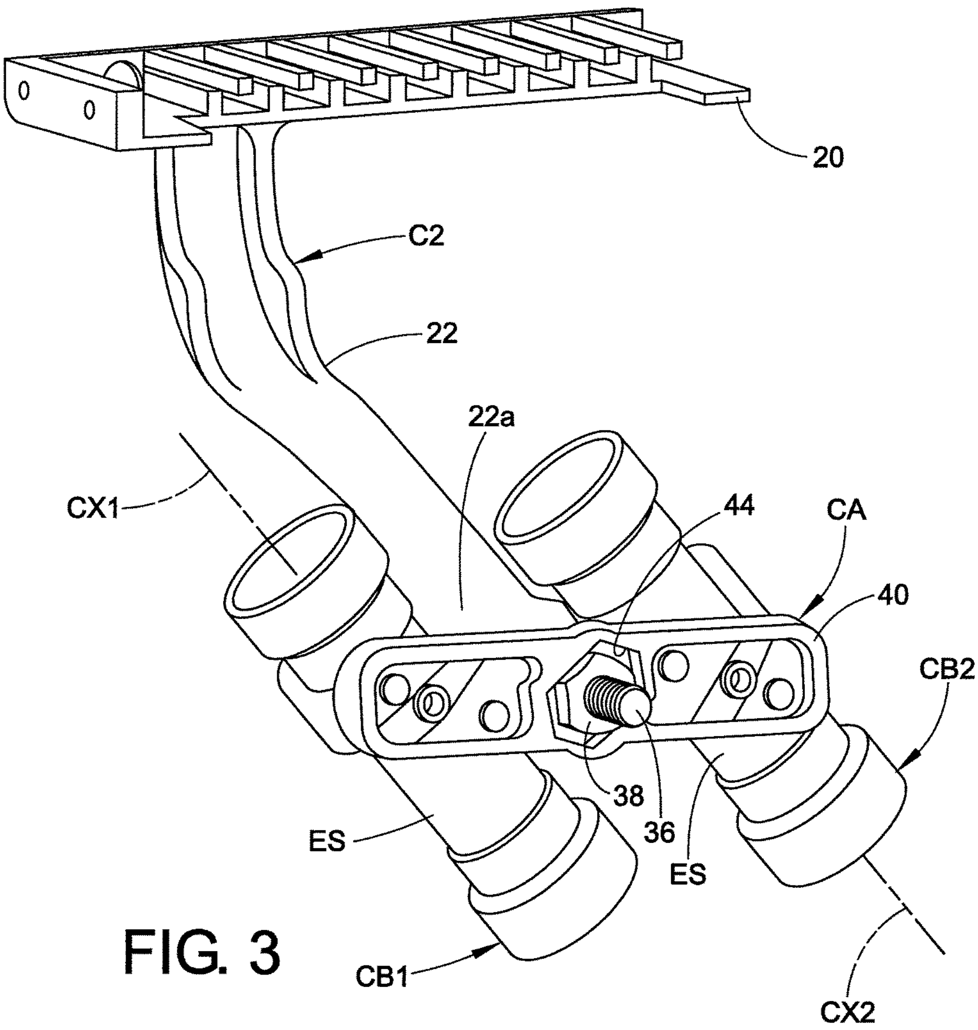
FIG. 3 is an isometric view of the chassis of FIGS. 2A and 2B, separated from the module M, and further including a clamp in accordance with the present development operatively secured thereto to provide a clamp assembly for in accordance with an embodiment of the present development (FIG. 3 also shows portions of first and second associated cables operatively secured by the clamp assembly to provide strain relief and grounding)
Figure 3A:
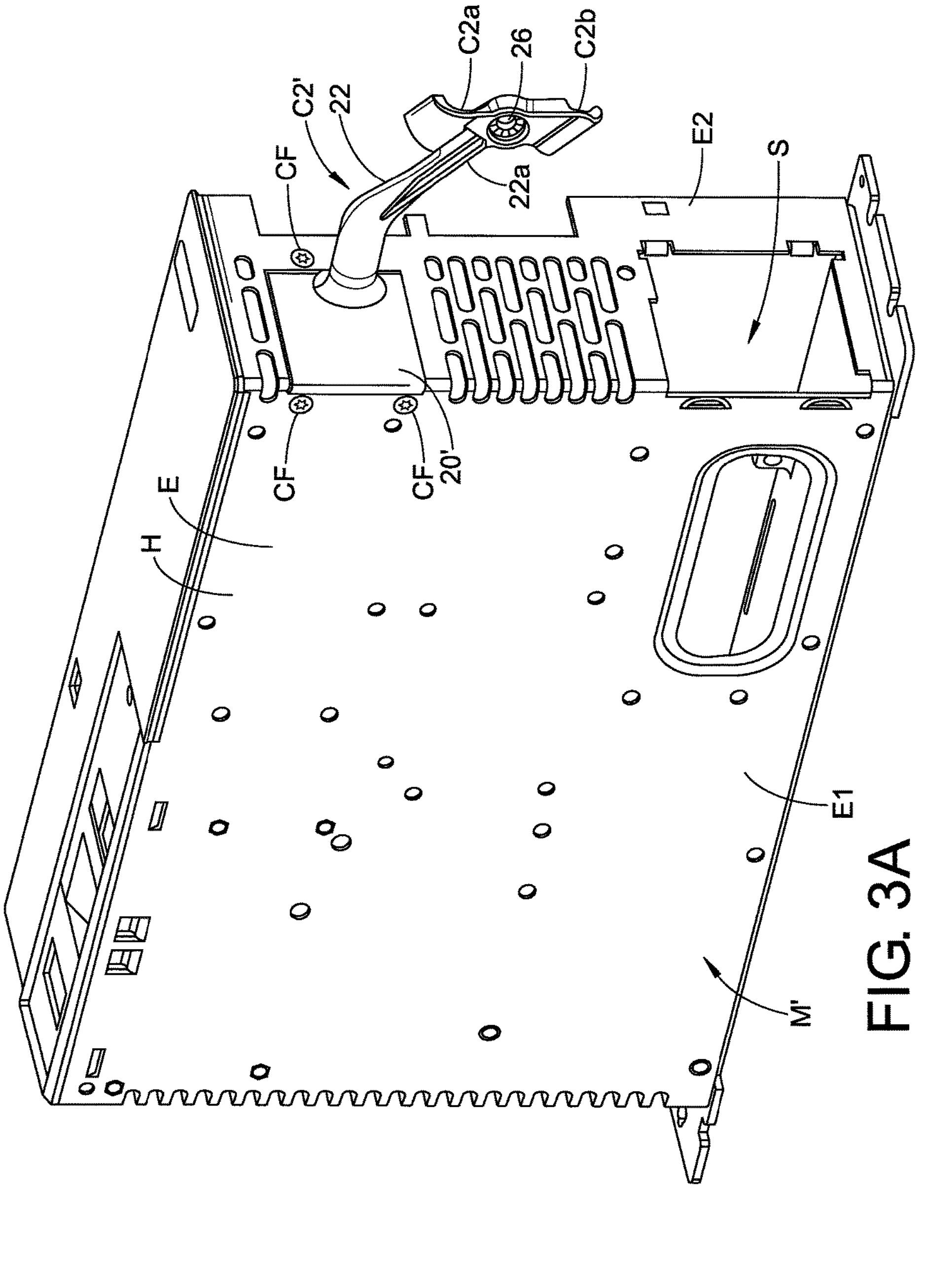
FIG. 3A provides an isometric view of an embodiment of a module housing comprising a sheet metal enclosure and including a cast or other monolithic cable clamp chassis secured thereto in accordance with the present development.
Figure 3B:
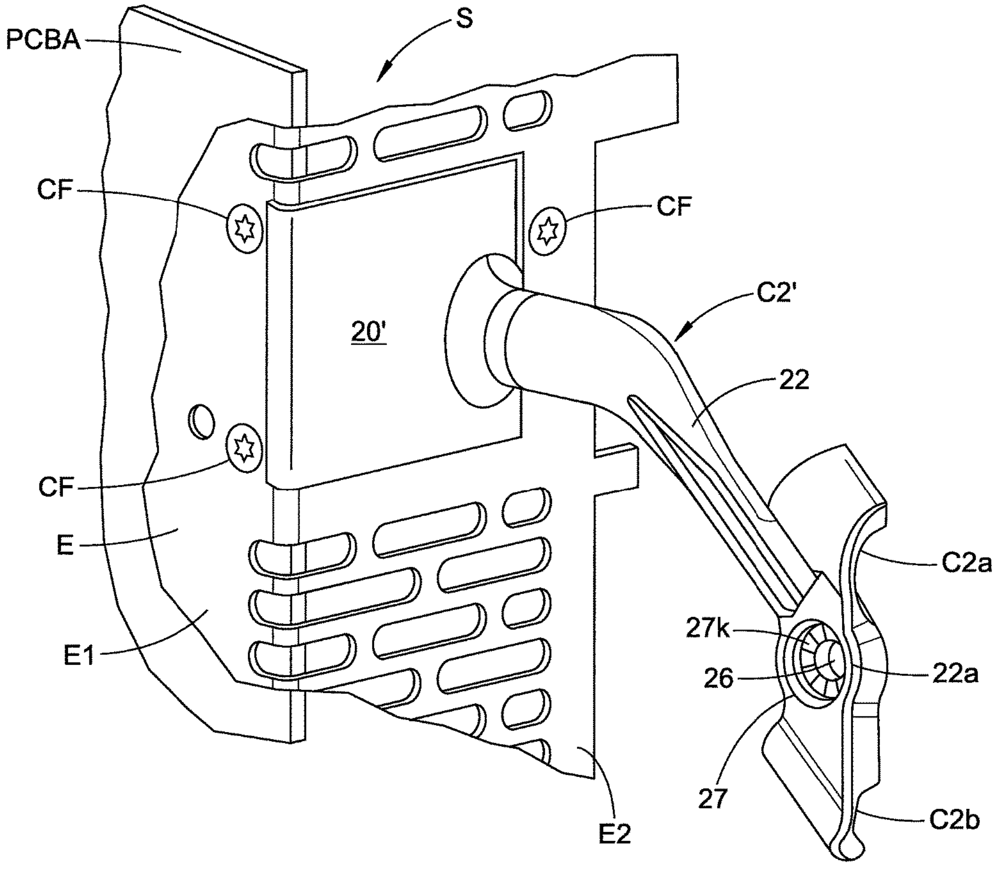
FIG. 3B is an isometric view that shows the cable clamp chassis of FIG. 3A by itself, and partially illustrates a printed circuit board assembly PBCA directly electrically connected to the cable clamp chassis by at least one mounting fastener.

FIG. 3A provides an isometric view of an embodiment of an alternative module M' including a housing H comprising a sheet metal wall structure E and a separate cable clamp chassis C2' according to the present development connected to one or more walls E1,E2 of the wall structure E using one of more base fasteners CF. FIG. 3B is similar to FIG. 3A but the sheet metal wall structure E is only partially shown to reveal a printed circuit board assembly PCBA located in the interior space S defined by the one or more sheet metal walls E1,E2 of the wall structure E. The printed circuit board assembly PCBA includes electronic components for performing a desired operative function using power and/or data transmitted to and/or from the cables CB1 and/or CB2 (the cables are not shown in FIGS. 3A and 3B but are shown in FIG. 3). Except and otherwise shown and/or described herein, the cable clamp chassis C2' is identical to the cable clamp chassis C2, and discussion of such parts of the cable clamp chassis C2' is not repeated here, and like parts of the cable clamp chassis C2' relative to the cable clamp chassis C2 are identified with like reference characters. In one embodiment, one or more of the base fasteners CF used to secure the base 20' of the cable clamp chassis C2' to the sheet metal wall structure E extend through apertures defined in the base 20' of the cable clamp chassis C2' and are threadably received directly into the printed circuit board assembly PCBA and electrically connect with a ground path of the printed circuit board assembly PCBA to provide a direct electrical connection between the cable clamp chassis C2' and the ground path of the printed circuit board assembly PCBA. Alternatively or additionally, the ground path electrical connection is conducted from the cable clamp chassis C2' through the sheet metal wall structure E to the printed circuit board assembly PCBA.

The clamp chassis C2 includes at least first and second (and optionally three or more) cable receiving or cable mounting locations C2*a*,C2*b* that are dimensioned and otherwise adapted to receive respective first and second cables CB1,CB2. The first and second cables CB1,CB2 (FIG. 3) include respective longitudinal axes CX1,CX2. As illustrated herein, each cable receiving location C2*a*,C2*b* comprises an axially extending recess with its inner surface comprising a circular arc segment, although the recess can have a non-cylindrical surface such as an ovalized surface or a polygonal surface, or any combination of surfaces.

The cable mounting locations C2*a*,C2*b* are located adjacent a common first reference plane P that extends parallel to the left and right sidewalls S1,S2 such that the cables CB1,CB2 respectively located in the receiving locations C2*a*,C2*b* are centered on the plane P, i.e., the longitudinal axis of each cable CB1,CB2 lies in the plane P. The first plane P preferably lies approximately midway between the left and right sidewalls S1,S2. With the two or more cables CB1,CB2 aligned in a single first plane P, the cables CB1, CB2 are located where they will not interfere with adjacent modules or the cables associated with same.

Each cable receiving location C2*a*,C2*b* includes an inner surface IS (see also FIG. 4) that abuts a cable CB1,CB2 located therein, and the innermost point on each inner surface IS, in terms of the depth of the cable receiving location C2*a*,C2*b*, is tangent to a common second reference plane P2 that lies parallel to but is offset from the first reference plane P by a distance equal to half the maximum diameter of the cables CB1,CB2 to be accommodated which locates the axis of each cable CB1,CB2 in the reference plane P. As described more fully below and as shown in FIG. 3, the outer electrical insulation of the cables CB1,CB2 is removed in the region where the cables CB1,CB2 are respectively seated in the cable receiving locations C2*a*,C2*b* to expose an electrically conductive sheath ES of the cable such that the cable sheath ES is electrically connected to the clamp chassis C2 for conducting electrical interference in the cable sheath ES to a ground path of the module M through the clamp chassis C2.

Figure 4:
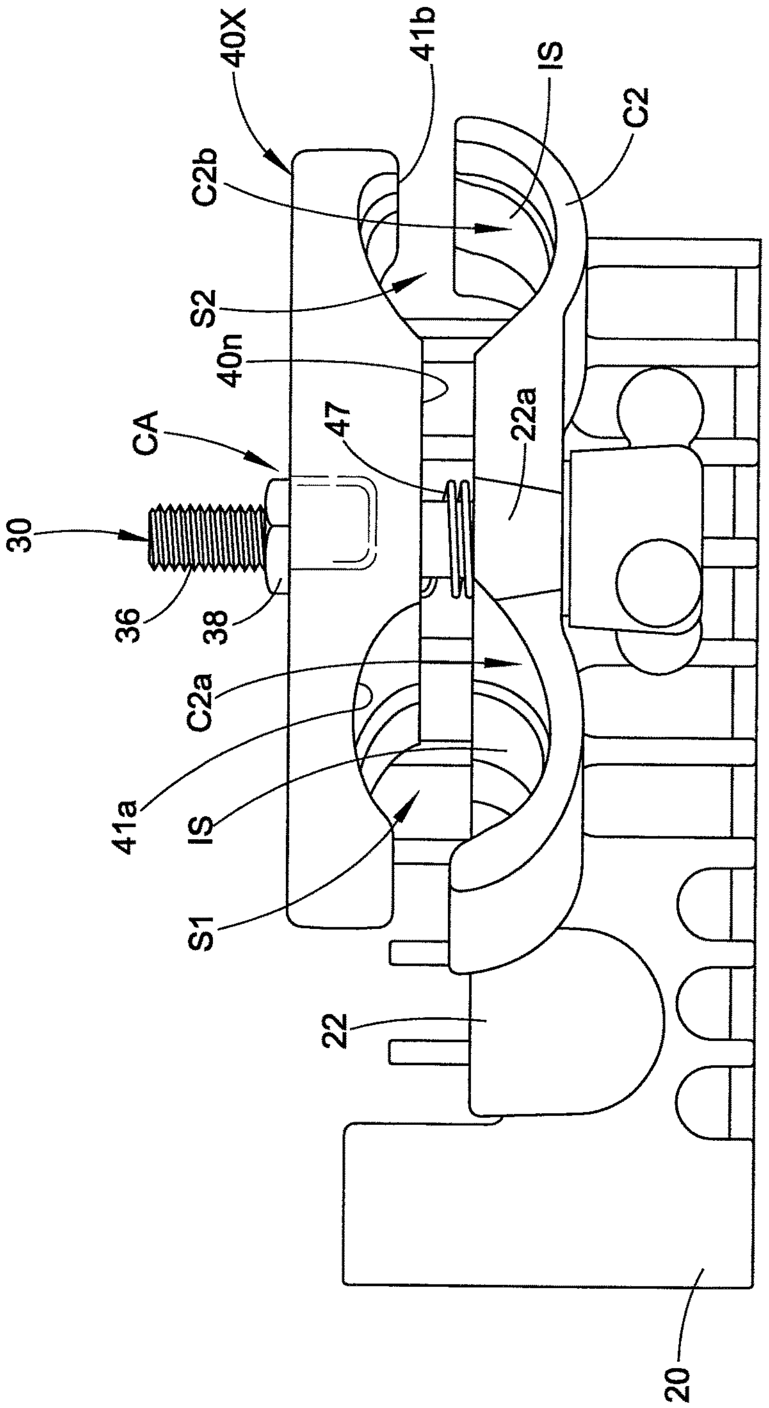
FIG. 4 is a bottom view of the clamp assembly of FIG. 3, with the cable portions removed to better show the structure of the clamp assembly.

FIG. 3 is an isometric view of the clamp chassis C2 of FIGS. 2A and 2B, separated from the module M, and further including a clamp bar or clamp 40 operatively secured thereto to provide a clamp assembly CA in accordance with an embodiment of the present development. FIG. 4 is a bottom view of the clamp assembly of FIG. 3, with the cables CB1,CB2 removed to better show the structure of the clamp assembly CA. The clamp chassis C2 includes a base 20 connected to or adapted to be connected to a wall of the module M, and includes an elongated arm 22 projecting outwardly from the base 20. The first and second cable receiving locations C2*a*,C2*b* are connected to an outer end 22*a* of the arm, and are located on opposite sides of the arm 22 relative to each other. The clamp chassis C2, including the base 20, arm 22 and first and second cable receiving locations C2*a*,C2*b* are preferably constructed as a one-piece metallic structure such as a cast structure, e.g., a zinc die casting.

The outer end 22*a* of the arm 22 includes an aperture 26 (see also FIGS. 2B and 5) defined there through and located between the first and second cable receiving locations C2*a*, C2*b*. The aperture 26 is adapted to receive a clamp fastener 30 which is rotatable in the aperture 26. The fastener 30, shown by itself in FIG. 6, comprises a first end 32 including an enlarged driving head 34 adapted to be manually engaged by a user for rotation of the fastener. The head 34 can additionally or alternatively be adapted for engagement by a tool such as a wrench or screwdriver for user rotation of the fastener 30. The fastener 30 comprises a shank 36 that projects outwardly from the head 34 and that includes threads 36*t*. The shank 36 is defined about and extends axially along a longitudinal axis 36*x*. Between the head 34 and the shank 36, the fastener comprises a shoulder region 35 including a cylindrical outer surface 35*s* and a transverse lock face 35*f* including at least one and preferably a plurality of locking features or projections 35*k* that extend outwardly from the lock face 35*f*. In the illustrated embodiment, the locking features 35*k* comprise a plurality of helical teeth HT each comprising a ramped lock face LF that function as described in more detail below to inhibit unintended rotation of the fastener 30 in a direction that would retract or “loosen” the nut 38 due to shock and vibration.

The clamp fastener 30 is used to secure the clamp 40 in its operative position relative to the clamp chassis C2. In particular, the clamp 40 comprises an elongated bar structure or body including first and second cable receiving recesses 41*a*,41*b* defined in an inner surface 40*n* that faces the clamp chassis C2 and configured to receive an associated cable CB1,CB2 such that the clamp 40 engages each cable CB1, CB2 in a saddle arrangement. In the illustrated embodiment, each cable receiving recess 41*a*,41*b* includes an inner surface comprising a circular arc segment or another curved surface.

Figure 9:
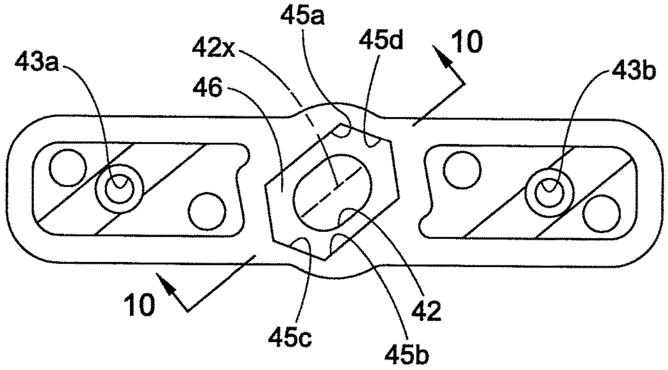
FIG. 9 is a side view of the clamp of the clamp assembly of FIGS. 3 and 4.
Figure 10:
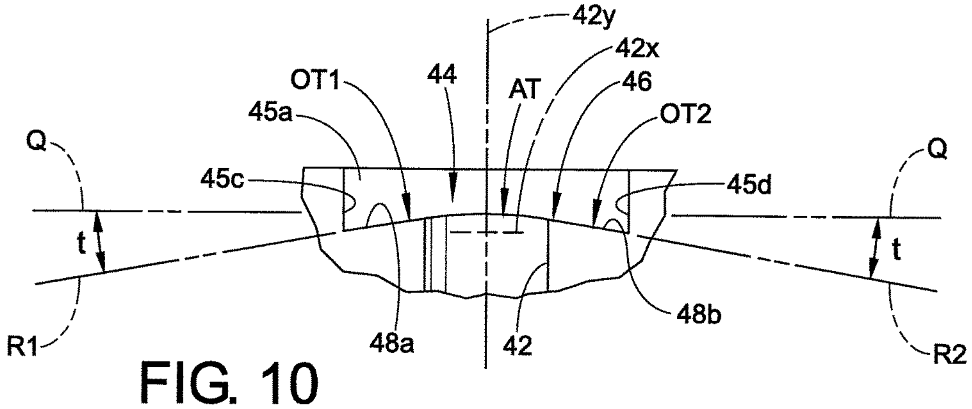
FIG. 10 is a partial section view of the clamp as taken at line 10-10 of FIG. 8.

The clamp 40 is shown separately in FIGS. 9 and 10 and further includes an aperture 42 through which the fastener shank 36 extends located between the first and second cable receiving recesses 41*a*,41*b*, and a nut 38 is threaded on the outer end of the shank to capture the clamp 40 on the shank 36 of the fastener 30. The clamp 40 includes a recess 44 surrounding the aperture 42 in an outer surface 40*x* that is arranged opposite the inner surface 40*n* that faces the clamp chassis C2, and the aperture 42 opens through the recess 44. The nut 38 is at least partially received in the recess 44 and the nut 38 is non-rotatably engaged with the recess 44. The recess 44 includes opposite first and second side walls 45*a*,45*b* between which the nut 38 is closely received with some clearance, and the side walls 45*a*,45*b* restrain/limit rotation of the nut 38 in the recess 44 due to engagement of respective flats of the nut 38 with the side walls 45*a*,45*b* such that the nut is restrained against rotation with the fastener 30 when the fastener is rotated so that rotation of the fastener 30 in a first direction advances (tightens) the nut 38 on the threaded portion of the shank 36, and rotation of the fastener in an opposite second direction retracts (loosens) the nut 38 on the threaded portion of the shank 36. The recess also includes opposite first and second end walls 45*c*,45*d* that connect the opposite ends of the side walls 45*a*,45*b*. The clamp 40 is preferably defined from an electrically conductive material, such as a one-piece metallic casting or other structure, such as a one-piece zinc die casting or other one-piece or fabricated multi-piece metal structure.

In use, as shown in FIG. 3, the clamp 40 is operatively secured to the clamp chassis C2 using the fastener 30 and mating nut 38. When the clamp 40 is positioned in its operative position, the first and second cable receiving recesses 41*a*,41*b* thereof are arranged in opposed spaced-apart facing relation with the first and second cable receiving locations C2*a*,C2*b* of the clamp chassis, respectively, such that respective first and second cable receiving spaces S1,S2 (FIG. 4) are defined there between. The cable receiving spaces S1,S2 are respectively adapted to accommodate and retain the cables CB1,CB2 when the fastener 30 is rotated sufficiently to advance the nut 38 on the threaded shank 36 to a location where the clamp 40 captures the cables CB1, CB2 in the spaces S1,S2 defined between the cable receiving locations C2*a*,C2*b* of the clamp chassis and the cable receiving locations 41*a*,41*b* of the clamp. When the cables CB1,CB2 are operatively secured by the clamp assembly CA as just described, the exposed EMI sheath ES of the first cable CB1 is in contact with and electrically connected to the first cable receiving locations C2*a*,41*a* of the chassis and clamp, and the exposed EMI sheath ES of the second cable CB2 is in contact with and electrically connected to the second cable receiving locations C2*b*,41*b* of the chassis and clamp, such that the sheath ES of each cable CB1,CB2 is electrically connected to a ground path of the module M, which includes the clamp chassis C2. The fastener 30 electrically connects the clamp 40 and clamp chassis C2. In an alternative embodiment, the clamp aperture 42 is tapped with threads and directly engaged by the threaded fastener shank 36 to secure the clamp 40 in its operative position.

In the illustrated embodiment, the clamp assembly CA comprises a spring 47 that biases the clamp 40 outwardly away from the clamp chassis C2 to facilitate cable insertion and removal from the spaces S1,S2. In one embodiment as shown herein, the spring 47 comprises a coil spring coaxially positioned about the fastener shank 36 and located between the clamp chassis C2 and the clamp 40. Because the spring 47 biases the clamp 40 away from the clamp chassis C2, the nut 38 will be located in the recess 44, even when no cables CB1,CB2 are present, which facilitates one-handed operation of the fastener 30, i.e., the fastener 30 can be rotated and the nut 38 will be restrained against rotation due to its presence in the recess 44. When the fastener 30 is loosened to open the spaces S1,S2 sufficiently to receive the cables CB1,CB2, the cables can be easily inserted because the clamp 40 is maintained spaced-apart from the clamp chassis C2 by the spring 47. Of course, the biasing force of the spring 47 is overcome when the fastener 30 is rotated to advance the nut 38 and draw the clamp 40 toward the clamp chassis C2 and capture the cables CB1,CB2 in the spaces S1,S2, respectively. The fastener threads 36*t* can be deformed or obstructed at the outer end 36*e* of the shank to provide resistance to rotation of the nut 38 in such region, to provide a tactile indication to a user that the nut is located near the outer end 36*e* of the shank to reduce the likelihood that the fastener 30 is completely unthreaded from the nut.

Figure 8:
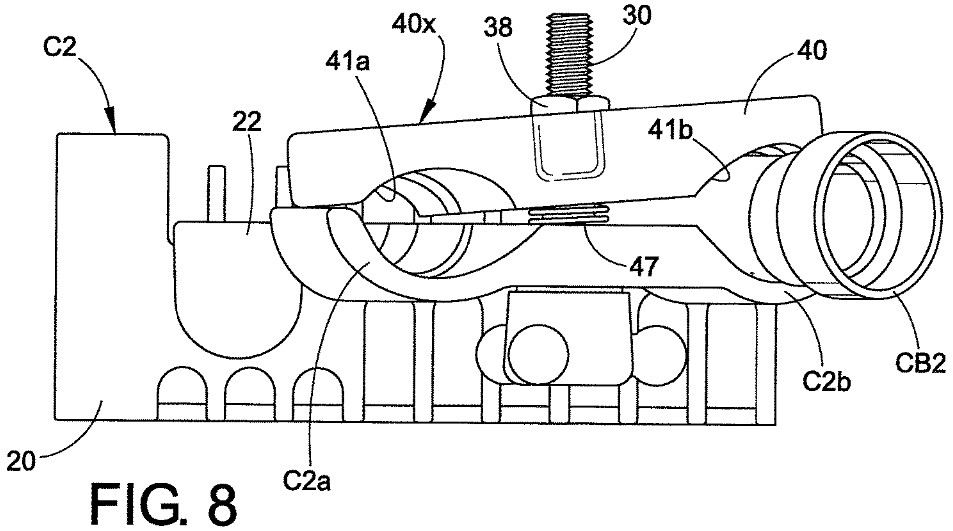
FIG. 8 is a bottom view similar to FIG. 4, but showing a single associate cable operatively secured to the clamp assembly, and showing the clamp pivoted to an offset operative position.

In some cases, such as when the cables CB1,CB2 are different diameters or when one of the cables CB1,CB2 is absent as shown in FIG. 8, the clamp 40 is designed to pivot to an offset operative position where the cable receiving spaces S1,S2 are unequal sizes relative to each other due to pivoting movement of the clamp 40 about the longitudinal axis CX1,CX2 of the larger diameter cable if two cables CB1,CB2 are present, or about the longitudinal axis CX1, CX2 of the single cable if only one cable CB1 or CB2 is being retained by the clamp assembly CA as shown in FIG. 8. To enable the clamp 40 to pivot as shown in FIG. 8 (or to pivot in the opposite direction if the cable CB1 is present and the cable CB2 is absent), the aperture 42 of the clamp 40 is elongated or ovalized, along a major axis 42*x*, and the recess 44, itself, is also elongated along the major axis 42*x*. The aperture 42 extends axially through the clamp 40 between the inner and outer surfaces thereof 40*n*,40*x* along a longitudinal or central axis 42*y*. The major axis 42*x* intersects and is arranged perpendicular to the central axis 42*y* of the aperture 42.

Referring now also to the section view of FIG. 10, the recess 44 includes an inner wall or floor 46 arranged transverse to the side walls 45*a*,45*b* and end walls 45*c*,45*d*. The floor 46 is not planar but, instead comprises first and second offset, angled, or tapered floor surfaces or portions 48*a*,48*b* located on opposite first and second sides of the aperture 42, with the first offset floor portion 48*a* located between the first end wall 45*c* and the aperture 42, and the second offset floor portion 48*b* located between the second end wall 45*d* and the aperture 42. The first and second offset floor portions 48*a*,48*b* are offset by an angle t relative to a reference plane Q that lies tangent to the floor 46 at the intersection of the floor 46 and the aperture 42, with the angle t being measured between the reference plane Q and respective floor planes R1,R2. The floor planes R1,R2 are either respectively coincident with the first and second offset floor portions 48*a*,48*b* if the floor portions 48*a*,48*b* are planar, or the floor planes R1,R2 are respectively tangent with the first and second offset floor portions 48*a*,48*b* if the floor portions 48*a*,48*b* are curved. As such, the first and second offset floor surfaces 48*a*,48*b* are spaced from the reference plane Q a greater distance when measured adjacent the respective first and second end walls 45*c*,45*d* as compared to when measured adjacent the aperture 42, with the distance equal to zero at the intersection of the aperture 42 with the floor 46. Thus, a respective distance defined between the first and second offset floor surfaces 48*a*,48*b* and the outer surface 40*x* of the clamp 40 increases as the first and second offset floor surfaces 48*a*,48*b* extend away from said central axis 42*y* of said clamp aperture 42 along said major axis 42*x*. The region of the floor surrounding and adjacent the aperture 42 defines and provides a primary axial thrust surface AT, and the first and second offset floor portions 48*a*,48*b* define and provide first and second offset thrust surfaces OT1,OT2.

Figure 11B:
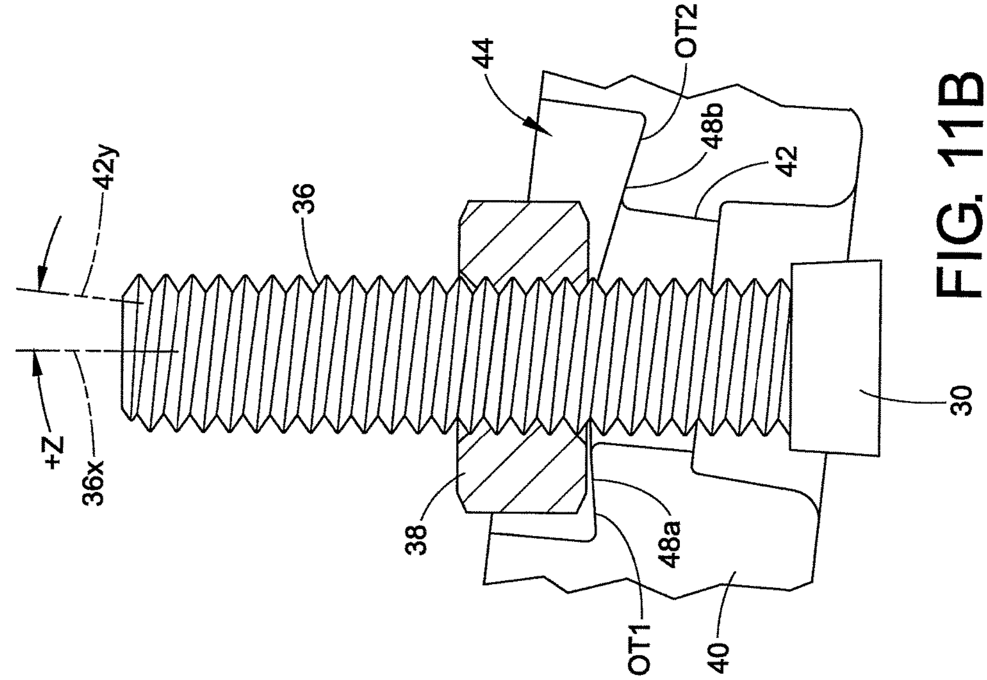
FIGS. 11A and 11B diagrammatically show the clamp in its first and second angularly offset positions relative to the fastener and nut of the clamp assembly, respectively.
Figure 11A:
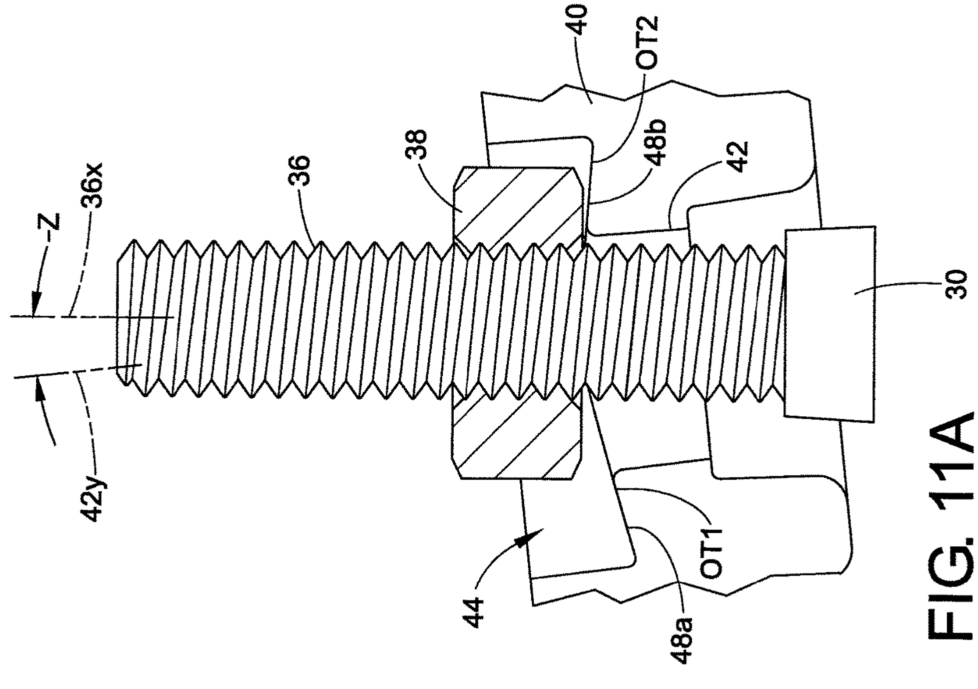

FIGS. 11A and 11B diagrammatically show the clamp 40 in its first and second angularly offset positions relative to the fastener shank 36 and nut 38, respectively. More particularly, FIG. 11A corresponds to FIG. 8 and shows the clamp 40 pivoted about the longitudinal axis CX2 of the cable CB2 to a first angularly offset position. As such, a clamp offset angle −z is defined between the longitudinal axis 36*x* of the fastener shank 36 and the central axis 42*y* of the clamp aperture 42, and the nut 38 is abutted with the second offset thrust surface OT2. FIG. 11B illustrates an opposite arrangement relative to FIG. 11A in which the clamp 40 is pivoted about the longitudinal axis CX1 of the first cable CB1 to a second angularly offset position when the second cable CB2 is absent (the first and second cables are not shown in FIGS. 11A and 11B). In FIG. 11B, a clamp offset angle +z is defined between the longitudinal axis 36*x* of the fastener shank 36 and the central axis 42*y* of the clamp aperture 42, and the nut 38 is abutted with the first offset thrust surface OT1. Those of ordinary skill in the art will recognize that the elongated aperture 42 and elongated recess 44 allow the clamp 40 to move relative to the fastener shank 36 and nut 38 to the first and second angularly offset positions without bending stresses being exerted on the shank 36 and threads thereof, and the first and second offset thrust surfaces OT1,OT2 are oriented such that the nut 38 exerts thrust forces on clamp 40 and opposite reaction forces on the shank 36 that are both coincident with the longitudinal axis 36*x* of the fastener shank 36. This elimination bending stress on the fastener shank 36 increases the durability of the fastener 30 and allows the fastener 36 to be made less robust and using less expensive material such as zinc or another suitable low-cost material.

Figure 5:
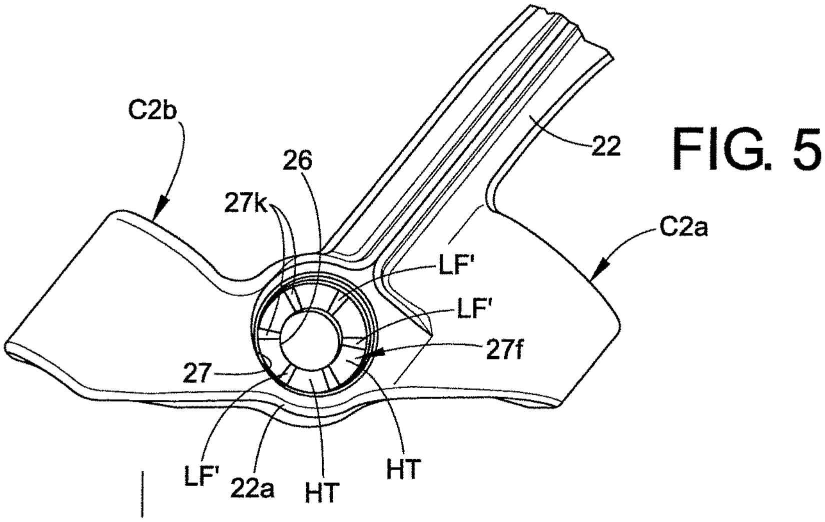
FIG. 5 is a partial left side view if the chassis of FIG. 2A as taken at line 5-5 of FIG. 2A showing the chassis fastener locking features in accordance with the present development.

As noted above, the fastener 30 preferably comprises locking features 35*k* that engage and coact with the clamp chassis C2 to inhibit unintended rotation of the fastener 30 in a direction (counter-clockwise in the present example) that would cause the nut 38 to retract or "loosen" on the shank 36. In this regard, as shown in FIG. 5, the aperture 26 of the clamp chassis C2 includes a counter bore 27 comprising a transverse face 27*f* including a plurality of including at least one and preferably a plurality of locking features or projections 27*k* that extend outwardly from the lock face 27*f*. In the illustrated embodiment, the locking features 27*k* correspond to the fastener locking features 35*k* and thus comprise a plurality of helical teeth HT each comprising a ramped lock face LF', wherein the lock faces LF,LF' are oriented so that they will lie parallel to and abut each other when the shoulder region 35 of the fastener 30 is received in the counter bore 27 when the fastener 30 is operatively installed in the aperture 26 of the clamp chassis C2. The abutted lock faces 27,27' will inhibit rotation of the fastener 30 in a direction that would cause the nut 38 to retract or "loosen" on the shank 36. Alternative projecting locking features 27*k*,35*k* are contemplated and the present development is not to be limited to the illustrated embodiment.

Figure 7:
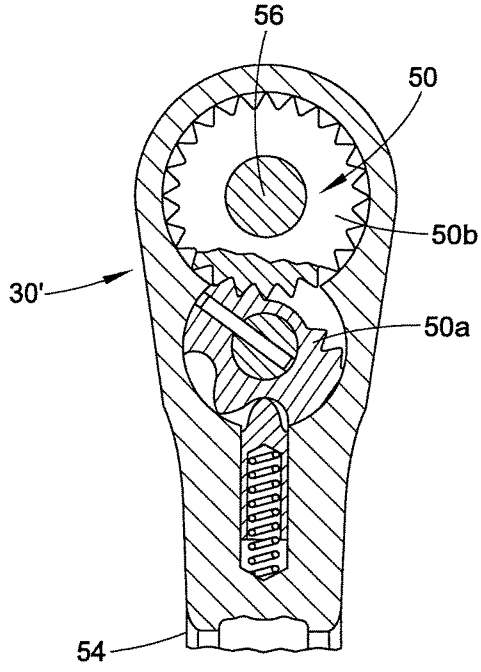
FIG. 7 is a section view that illustrates an alternative fastener including a ratchet mechanism to facilitate tightening and loosening of the fastener without requiring additional tools.

FIG. 7 is a section view of an alternative embodiment of the fastener 30' which includes a ratchet mechanism 50. The fastener 30' comprises a handle 54 adapted to be grasped by a user to rotate the threaded shank 56 in a first direction or a second direction to advance (tighten) or retract (loosen) the nut 38. The handle 54 is operatively connected to the shank 36 by the ratchet mechanism 50 including a pawl 50*a* and ratchet wheel 50*b*, wherein the ratchet wheel 50*b* is connected to the shank 56 such that the shank 56 rotates with the ratchet wheel 50*b*. The pawl 50*a* is manually moved between first and second operative positions where it engages the ratchet wheel 50*b* in first and second orientations to allow torque to be transmitted from the handle 54 to the ratchet wheel 50*b* in first and second directions, respectively, and allows freewheeling of the handle 54 relative to the ratchet wheel 50*b* in the opposite direction. Further details of the ratchet mechanism are described in U.S. Pat. No. 1,957,462, the entire disclosure of which is hereby expressly incorporated by reference into the present specification.

Figure 6:
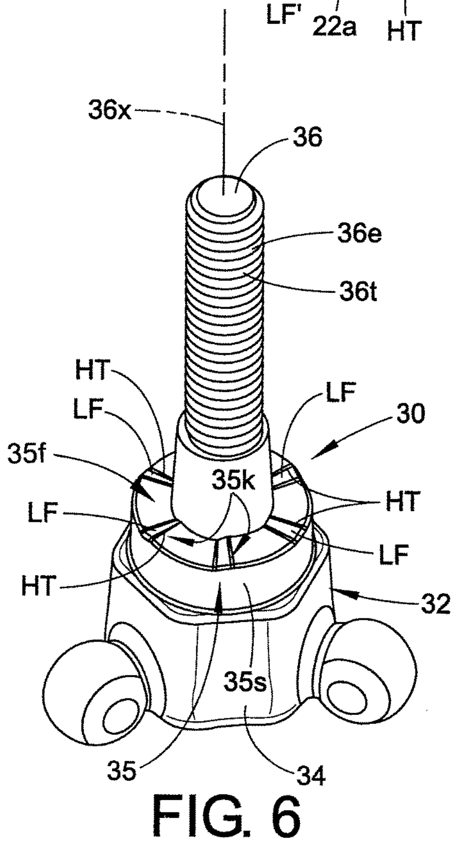
FIG. 6 is a greatly enlarged isometric view of the fastener of the clamp assembly of FIGS. 3 and 4 showing the locking features of the fastener.
Figure 6A:
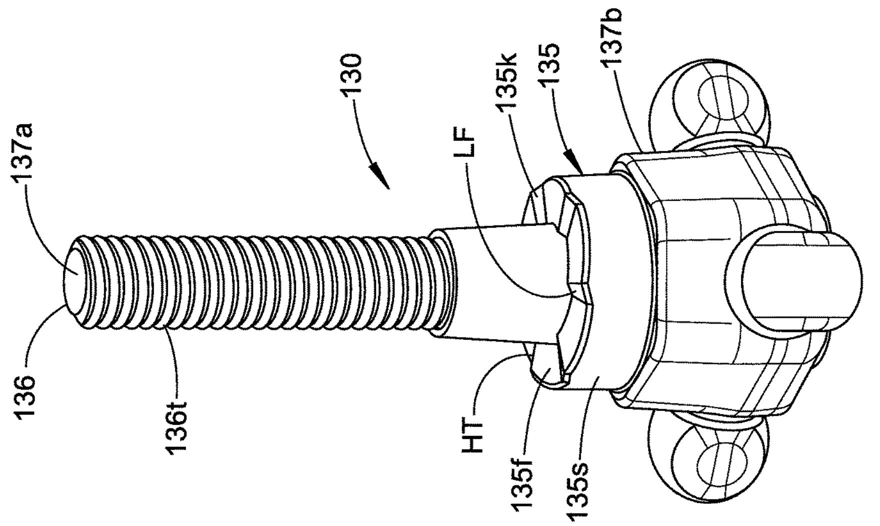
FIGS. 6A and 6B are respectively isometric and section views of a first alternative fastener formed in accordance with the present development.
Figure 6B:
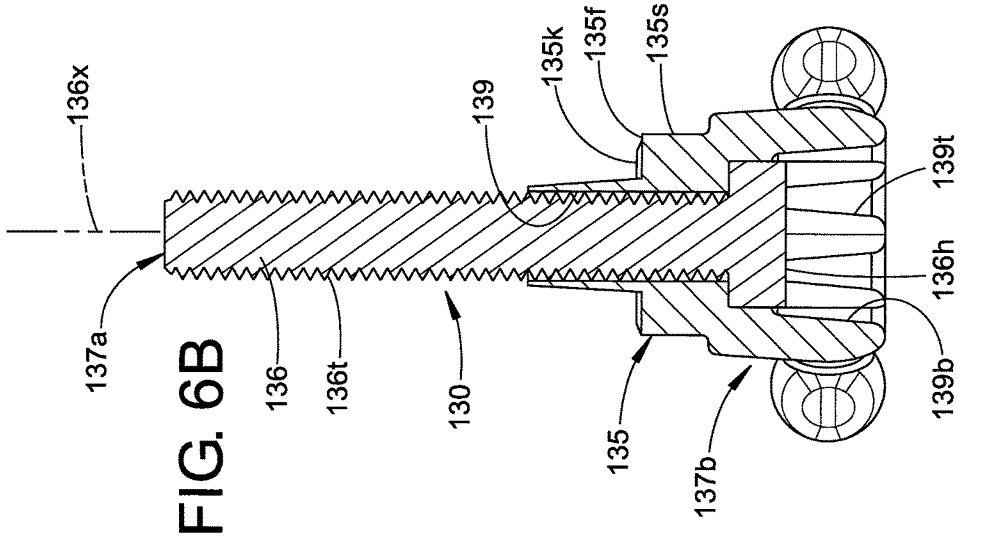
Figure 6C:
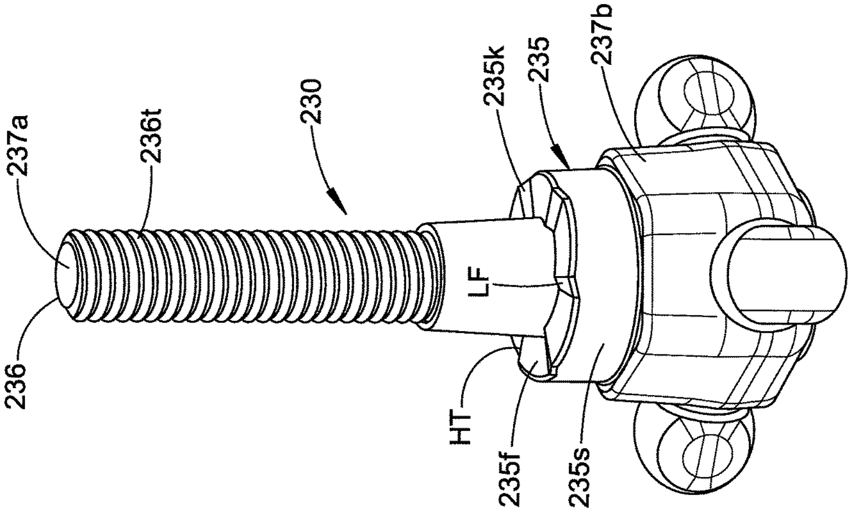
FIGS. 6C and 6D are respectively isometric and section views of a second alternative fastener formed in accordance with the present development.
Figure 6D:
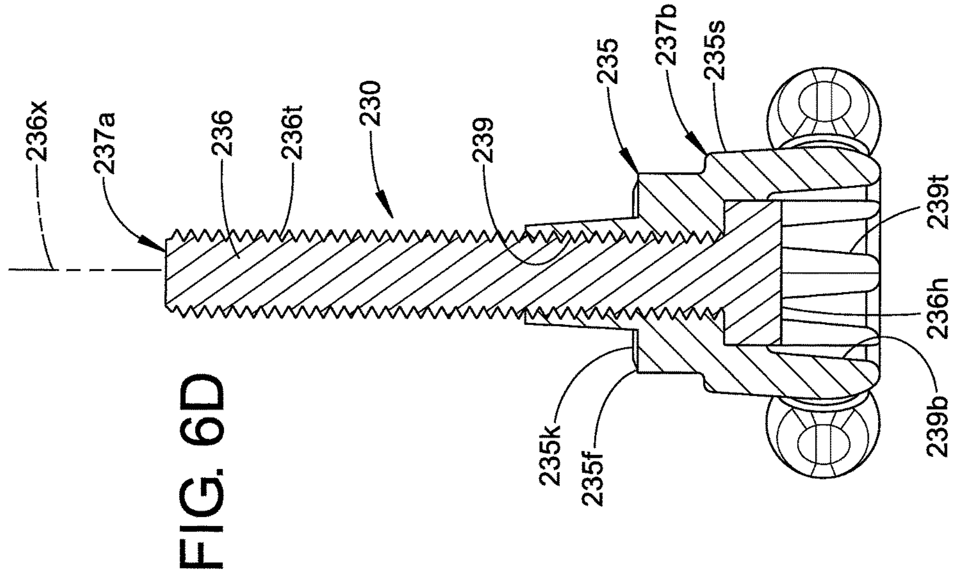

As shown in FIG. 6, the fastener 30, including the head 34 (sometimes also referred to as a "lever") and shank 36, comprises a one-piece cast metallic structure such as a cast zinc or aluminum structure. In certain applications, however, a one-piece cast structure for the fastener 30 has insufficient strength to accommodate the high-torque or bending stresses exerted on the fastener shank 36, which can lead to deformation or breakage of the fastener shank 36 or stripping of the threads 36*t*. FIGS. 6A and 6C respectively illustrate another alternative fastener 130, 230 formed in accordance with the present development, and FIGS. 6B and 6D are section views of the fasteners 130 and 230, respectively. Except as otherwise shown and/or described, the fasteners 130 and 230 are each identical to the fastener 30, but the fasteners 130 and 230 each comprise a two-piece assembly including a bolt 137*a*,237*a* and a lever or fastener head 137*b*,237*b* that is non-rotatably engaged with the bolt 137*a*, 237*a*. The bolt 137*a*,237*a* is a standard threaded bolt defined from steel (i.e., carbon steel), stainless steel, or another suitable metal such as aluminum or the like and is selected to have the desired strength for a particular application. The bolt 137*a*,237*a* includes a shank 136,236 comprising threads 136*t*,236*t* and includes a hexagonal or other non-circular bolt head 136*h*,236*h*. Alternatively, the bolt head 136*h*,236*h* is circular and can include a hexagonal or other non-circular recess, extension, or other driving feature. The head 137*b*, 237*b* of the fastener 130,230 is defined from a separate cast metal, molded polymeric, or other structure, and the bolt 137*a*,237*a* is operably engaged with this fastener head 137*b*,237*b*. The fastener head 137*b*,237*b* comprises a central passage 139,239 through which the threaded shank 136,236 of the bolt extends. The fastener head 137*b*,237*b* is defined such that the central passage 139,239 includes a counterbore 139*b*,239*b* connected thereto and arranged coaxially therewith. The counterbore 139*b*,239*b* is defined with internal flats or other structures 139*t*,239*t* that provide the counterbore with a non-circular cross-section such that the non-circular bolt head 136*h*,236*h* is non-rotatably received in the counterbore 139*b*,239*b*. Alternatively, the bolt head 136*h*, 236*h* is frictionally or otherwise secured in the counterbore 139*b*,239*b* to be non-rotatable relative to the fastener head 137*b*,237*b*. As such, the bolt 137*a*,237*a* rotates about the axis of the bolt shank 136*x*,236*x* when the fastener head 137*b*,237*b* is manually rotated by a user to tighten or loosen the fastener 130,230. FIGS. 6A and 6B illustrate a fastener embodiment 130 in which the head 137*b* is defined from cast zinc or cast aluminum or another cast metal that slidably receives the bolt 137*a* through the central passage 139 as described. FIGS. 6C and 6D illustrate a fastener embodiment 230 in which the fastener head 237*b* is defined as a molded polymeric structure that is overmolded onto the bolt 237*a* (alternatively the molded polymeric structure for the fastener head 237*b* is defined as shown in FIG. 6A for the cast metal head 137*b* for slidably receiving the bolt 237*a* in the central passage 239). In one example, the fastener head 237*b* is molded from a glass-filled polymeric composition, but other filled or unfilled polymeric compositions can be used. In both the embodiments of FIGS. 6A and 6C, the fastener head 137*b*,237*b* comprises a shoulder region 135, 235 including a cylindrical outer surface 135*s*,235*s* and a transverse lock face 135*f*,235*f* including at least one and preferably a plurality of locking features or projections 135*k*,235*k* that extend outwardly from the lock face 135*f*, 235*f*. In the illustrated embodiment, the locking features 135*k*,235*k* comprise a plurality of helical teeth HT each comprising a ramped lock face LF that function as described herein in relation to the fastener 30 to inhibit unintended rotation of the fastener 30 in a direction that would retract or "loosen" the nut 38 due to shock and vibration.

Figure 12:
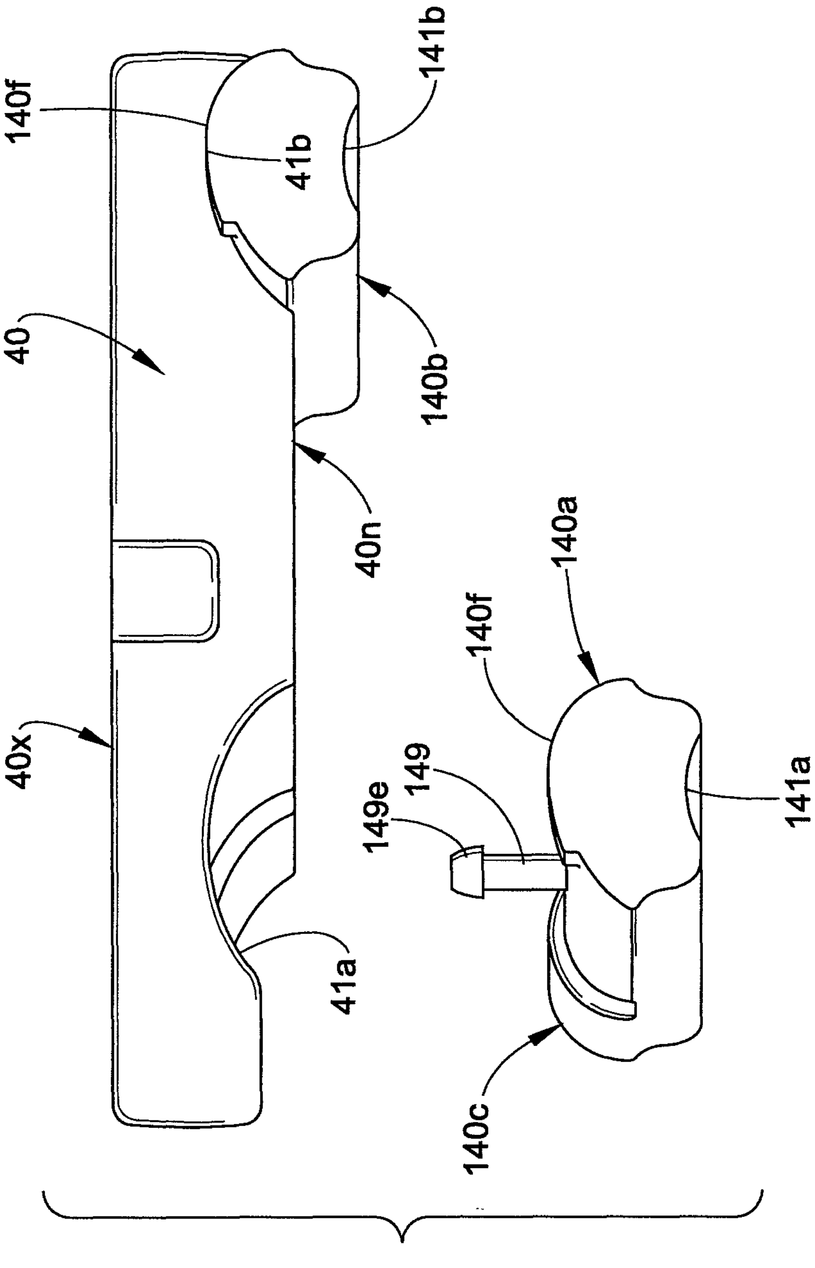
FIGS. 12 and 13 provide respective bottom and isometric views of the clamp of FIG. 9, further including a first cable size adapter operatively secured thereto and showing a second cable size adapter in an exploded condition relative to the clamp bar.
Figure 13:
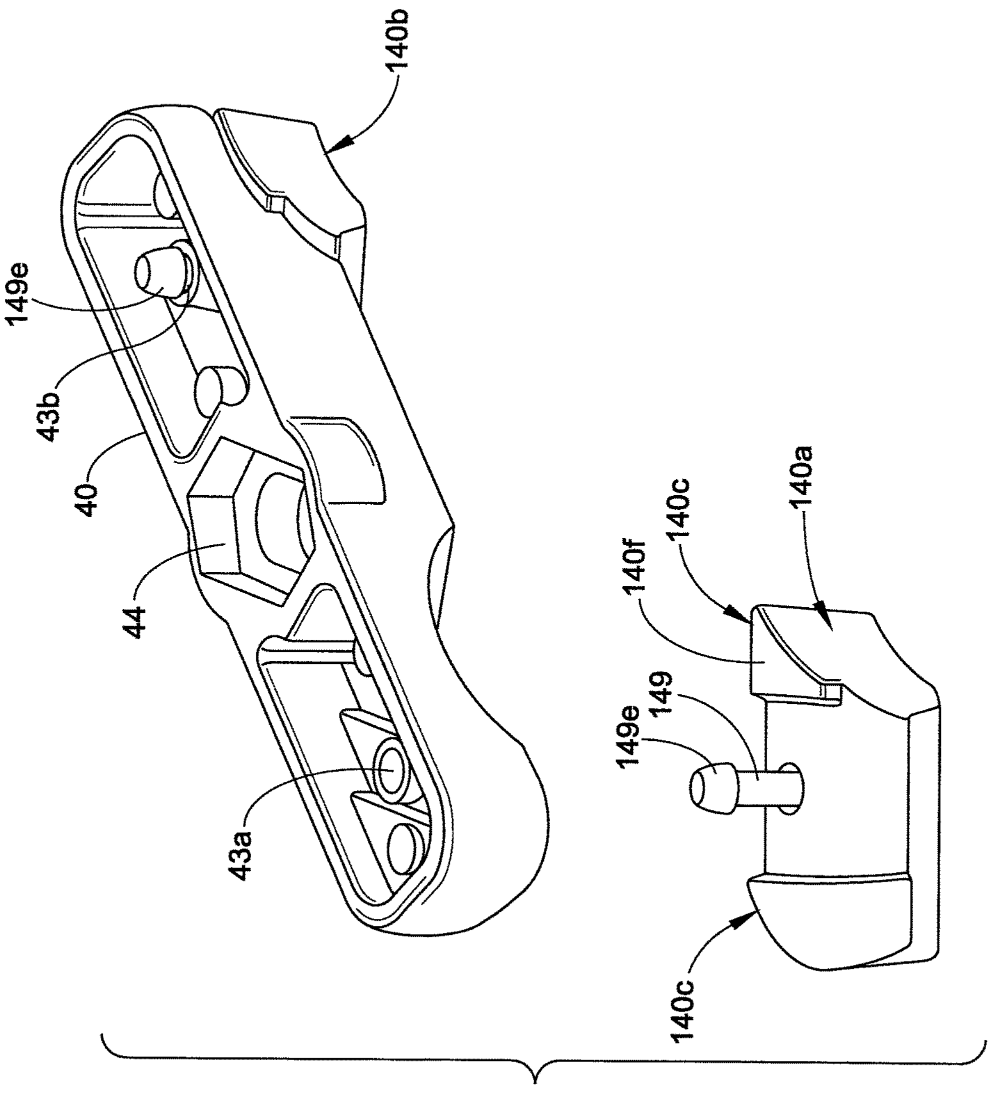

FIGS. 12 and 13 provide respective bottom and isometric views of the clamp 40, and further illustrate the structure and function of first and second cable size adapters 140*a*,140*b* that can be used together or individually as needed. The cable size adapters 140*a*,140*b* are identical to each other and are adapted to be selectively received in the first and second cable receiving locations 41*a*,41*b* of the clamp 40, with their respective inner faces 140*f* abutted with the cable receiving locations 41*a*,41*b*. The cable size adapters 140*a*,140*b* include outer faces located opposite the inner face 140*f* comprising respective concave cable receiving locations 141*a*,141*b* that are oriented outwardly away from and that are spaced outwardly from the cable receiving locations 41*a*,41*b* when the adapters 140*a*,140*b* are operatively installed on the clamp 40. When operatively connected/installed on the clamp 40 (as shown for the cable size adapter 140*b*), the cable size adapters 140*a*,140*b* partially fill and reduce the size of the cable receiving spaces S1,S2 defined between the first and second cable receiving locations C2*a*,C2*b* of the clamp chassis C2 and the clamp 40 to ensure that a smaller diameter cable is tightly engaged between the cable size adapters 140*a*,140*b* of the clamp 40 and the clamp chassis C2. In particular, the sheath ES of a smaller diameter cable will be abutted with the inner surface IS of the cable receiving locations C2*a*,C2*b* of the clamp chassis 40 on one side and will be abutted with the cable receiving locations 141*a*,141*b* of the adapters 140*a*,140*b* on the opposite side. The presence of the adapters 140*a*,140*b* ensures that the nut 38 can be advanced sufficiently on the fastener shank 36 to locate the clamp 40 where the cables will be tightly captured in the cable receiving spaces S1,S2 before the clamp 40 abuts the clamp chassis C2 or is otherwise prevented from moving closer to the clamp chassis C2.

The first and second cable size adapters 140*a*,140*b* are selectively connected to and disconnected from the clamp 40 as needed, without requiring any tools. In the illustrated embodiment, the clamp 40 comprises first and second mounting holes 43*a*,43*b* (see also FIG. 9) that open into the first and second cable receiving locations 41*a*,41*b*. Each adapter 140*a*,140*b* includes a post 149 with an enlarged outer end 149*e* projecting outwardly from its inner face 140*f*. The post 149 is adapted to be inserted into one of the mounting holes 43*a*,43*b* and the enlarged outer end 149*e* engages the clamp 40 with a snap-fit or otherwise such that the cable size adapter 140*a*,140*b* is captured to the clamp 40 with the inner surface 140*f* abutted with the respective cable receiving location 41*a*,41*b*. The inner surface 140*f* of each cable size adapter 140*a*,140*b* is curved such that it defines a cam surface 140*c*. To separate the cable size adapter 140*a*, 140*b* from the clamp 40, the cable size adapter is twisted relative to the clamp 40 such that the post 149 rotates in the hole 43*a*,43*b*, which causes the cam surface 140*c* to engage the cable receiving location 41*a*,41*b* of the clamp with a cam action that urges the cable size adapter 140*a*,140*b* outwardly away from the clamp 40 and out of the cable receiving location sufficiently such that the enlarged end 149*e* of the post is disengaged from the clamp 40 and the adapter 140*a*,140*b* can be manually separated from the clamp.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. An electronics module comprising:

a housing including a wall;

a cable clamp chassis projecting outwardly from the housing wall, said cable clamp chassis comprising first and second cable receiving locations respectively adapted to receive associated first and second cables;

a clamp secured to said cable clamp chassis by a fastener, said clamp adapted to secure the first and second associated cables in the first and second cable receiving locations;

wherein said fastener comprises a two-piece structure including a bolt and a head non-rotatably engaged with the bolt; and, wherein said cable clamp chassis further comprises: a base connected to said housing wall; and an elongated arm projecting outwardly from the base, wherein the first and second cable receiving locations are connected to an outer end of the arm.

2. The electronics module as set forth in claim 1, wherein said first and second cable receiving locations are located on opposite sides of an aperture defined in said cable clamp chassis such that said aperture is located between the first and second cable receiving locations, wherein said fastener extends through said aperture.

3. The electronics module as set forth in claim 2, wherein the arm, and wherein the first and second cable receiving locations are located on opposite sides of the outer end of the arm, and said aperture is defined in said arm.

4. The electronics module as set forth in claim 2, wherein said housing comprises a sheet metal wall structure that includes said wall as part thereof such that said wall is a sheet metal wall, and wherein said base of said cable clamp chassis is connected to the sheet metal wall of said housing by at least one base fastener, wherein said base fastener electrically connects said base of said cable clamp chassis to said sheet metal wall of said housing.

5. The electronics module as set forth in claim 1, wherein said clamp comprises first and second cable recesses, and wherein said fastener extends through aperture of said cable clamp chassis and through said clamp, and said fastener is engaged with a nut such that said fastener secures said clamp to said cable clamp chassis with said first and second cable recesses of said clamp located in opposed facing relation with said first and second cable receiving locations of said cable clap chassis, respectively, so that a first cable receiving space is defined between the first cable recess of the clamp and the first cable receiving location of the clamp chassis and a second cable receiving space is defined between the second cable recess of the clamp and the second cable receiving location of the clamp chassis, wherein said first and second cable receiving spaces are respectively adapted to accommodate and retain the first and second associated cables, with an EMI shield of each first and second associated cable electrically connected to said cable clamp chassis.

6. The electronics module as set forth in claim 5, wherein said housing comprises a sheet metal wall structure that includes said wall as part thereof such that said wall is a sheet metal wall, and wherein said base of said cable clamp chassis is connected to the sheet metal wall of said housing by at least one base fastener, wherein said base fastener electrically connects said base of said cable clamp chassis to said sheet metal wall of said housing.

7. The electronics module as set forth in claim 1, wherein:

said cable clamp chassis comprises an aperture defined therein, and wherein said aperture of said clamp chassis comprises a counterbore including a transverse face comprising a plurality of locking projections; and, said head of said fastener comprises a plurality of locking projections that engage said locking projections of said transverse face of said counterbore to inhibit rotation of said fastener relative to said clamp chassis.

8. The electronics module as set forth in claim 7, wherein said locking projections of said transverse face of said clamp chassis counterbore and said locking projections of said fastener each comprise a plurality of locking teeth each comprising a ramped lock face.

9. The electronics module as set forth in claim 1, wherein said housing comprises a sheet metal wall structure that includes said wall as part thereof such that said wall is a sheet metal wall, and wherein said base of said cable clamp chassis is connected to the sheet metal wall of said housing by at least one base fastener, wherein said base fastener electrically connects said base of said cable clamp chassis to said sheet metal wall of said housing.

10. The electronics module as set forth in claim 9, wherein a printed circuit board assembly is connected to said sheet metal wall structure and wherein said base fastener electrically connects said base of said cable clamp chassis to a ground path of said printed circuit board.

11. An electronics module comprising:

a housing including a wall;

a cable clamp chassis projecting outwardly from the housing wall, said cable clamp chassis comprising first and second cable receiving locations respectively adapted to receive associated first and second cables;

a clamp secured to said cable clamp chassis by a fastener, said clamp adapted to secure the first and second associated cables in the first and second cable receiving locations;

wherein said fastener comprises a two-piece structure including a bolt and a head non-rotatably engaged with the bolt;

wherein said bolt of said fastener comprises one of: (i) carbon steel; or (ii) stainless steel; and wherein said bolt comprises a threaded shank and a bolt head connected to said threaded shank; and, wherein said head of said fastener comprises a cast metal structure that is non-rotatably engaged with said bolt head.

12. The electronics module as set forth in claim 11, wherein said cast metal structure of said fastener head comprises a passage through which a threaded shank of said bolt extends, and comprises a counterbore connected to said passage, wherein said bolt head is located in said counterbore.

13. The electronics module as set forth in claim 12, wherein said counterbore comprises a non-circular cross-section that non-rotatably engages said bolt head.

14. An electronics module comprising:

a housing including a wall;

a cable clamp chassis projecting outwardly from the housing wall, said cable clamp chassis comprising first and second cable receiving locations respectively adapted to receive associated first and second cables;

a clamp secured to said cable clamp chassis by a fastener, said clamp adapted to secure the first and second associated cables in the first and second cable receiving locations;

wherein said fastener comprises a two-piece structure including a bolt and a head non-rotatably engaged with the bolt;

wherein said bolt of said fastener comprises one of: (i) carbon steel; or (ii) stainless steel; and wherein said bolt comprises a threaded shank and a bolt head connected to said threaded shank; and, wherein said head of said fastener comprises a polymeric structure that is non-rotatably engaged with said bolt head.

15. The electronics module as set forth in claim 14, wherein said polymeric structure of said fastener head comprises a passage through which a threaded shank of said bolt extends, and comprises a counterbore connected to said passage, wherein said bolt head is located in said counterbore.

16. The electronics module as set forth in claim 15, wherein said counterbore comprises a non-circular cross-section that non-rotatably engages said bolt head.

17. The electronics module as set forth in claim 14, wherein said polymeric structure of said fastener head is overmolded onto said bolt.

18. The electronic module as set forth in claim 14, wherein said polymeric structure of said fastener head comprises a glass-filled polymeric structure.

* * * * *